United States Patent
Yu (10) Patent No.: US 6,171,911 B1
(45) Date of Patent: Jan. 9, 2001

(54) METHOD FOR FORMING DUAL GATE OXIDES ON INTEGRATED CIRCUITS WITH ADVANCED LOGIC DEVICES

(75) Inventor: Mo-Chiun Yu, Taipei (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/395,284

(22) Filed: Sep. 13, 1999

(51) Int. Cl.$^7$ ................................. H01L 21/8234
(52) U.S. Cl. .................. 438/275; 438/199; 438/477; 438/216; 438/287
(58) Field of Search ................... 438/199, 201, 438/275, 770, 216, 287, 218, 225, 585, 906, 241, 477, 974

(56) References Cited

U.S. PATENT DOCUMENTS

| | | | |
|---|---|---|---|
| 4,277,320 | | 7/1981 | Beguwala et al. ............. 204/164 |
| 5,228,950 | | 7/1993 | Webb et al. .................. 156/643 |
| 5,244,843 | | 9/1993 | Chan et al. ................... 438/452 |
| 5,863,819 | | 1/1999 | Gonzalez ...................... 438/238 |
| 5,935,650 | * | 8/1999 | Lerch et al. ................. 427/255.4 |
| 5,989,948 | * | 11/1999 | Vines et al. .................. 438/216 |
| 6,033,943 | * | 3/2000 | Gardner ....................... 438/199 |
| 6,037,235 | * | 3/2000 | Narwankar et al. ............ 438/396 |

OTHER PUBLICATIONS

S. Wolf, "Silicon Processing for the VLSI Era", vol. 3, Lattice Press, Sunset Beach, CA, (1995), p. 438.

S. Wolf et al., "Silicon Processing for the VLSI Era", vol. 1, Lattice Press, Sunset Beach, CA, (1986), p. 516ff.

\* cited by examiner

Primary Examiner—Charles Bowers
Assistant Examiner—Hsien-Ming Lee
(74) Attorney, Agent, or Firm—George O. Saile; Stephen B. Ackerman (57) ABSTRACT

A process for significantly reducing the thickness of and improving the quality and uniformity of a native oxide film which is formed during the formation of MOSFET devices on a silicon wafer in a dual thickness gate oxide process. The native oxide forms on exposed silicon surfaces after selectively etching away regions of a first thicker gate oxide and prior to growing a thinner gate oxide. The thinner gate oxide used to form high performance devices is between about 15 and 50 Å thick. The native oxide which forms on the exposed silicon surfaces has an initial thickness of about 10 Å. After the selective regions have been patterned the wafer is cleaned using a totally HF free cleaning procedure and subjected to a low pressure rapid thermal annealing between about 600 and 1,050° C. in an ambient of $H_2$ and $N_2$. The residual oxide thickness is reduced to about 4 Å with an accompanying improvement in thickness uniformity and oxide quality. The residual film is more robust that the initial native oxide and forms a much smaller thickness component of the final thinner gate oxide. After the annealing treatment, the residual native oxide becomes a more robust form of silicon oxide.

9 Claims, 7 Drawing Sheets

METHOD FOR FORMING DUAL GATE OXIDES ON INTEGRATED CIRCUITS WITH ADVANCED LOGIC DEVICES

BACKGROUND OF THE INVENTION (1) Field of the Invention

The invention relates to processes for the manufacture of semiconductor devices and more particularly to processes for forming self-aligned polysilicon gate field effect transistors with dual thickness thin gate oxides.

(2) Description of Prior Art and Background to the Invention

Complimentary metal oxide semiconductor(CMOS) field effect transistor(FET) technology involves the formation n-channel FETs(NMOS) and p-channel FETs(PMOS) in combination to form low current, high performance integrated circuits. The complimentary use of NMOS and PMOS devices, typically in the form of a basic inverter device, allows a considerable increase of circuit density of circuit elements by reduction of heat generation. The increase in device density accompanied by the shrinkage of device size has resulted in improved circuit performance and reliability as well as reduced cost. For these reasons CMOS integrated circuits have found widespread use, particularly in digital applications.

The basic MOSFET, whether it be NMOS or PMOS is typically formed by a self-aligned polysilicon gate process. An region of active silicon region surface for the device is defined on a silicon wafer by an opening surrounded by field oxide isolation(FOX). A gate oxide is then grown on the exposed silicon regions and a polysilicon gate electrode is patterned over the gate oxide. Source and drain regions are next formed in the active region, typically by ion implantation. The device is completed by depositing an insulative layer over the wafer and forming contacts to the source/drain regions and to the gate electrode through openings in the insulative layer.

The performance of the MOSFET is inversely proportional to the gate oxide thickness. Efforts to enhance performance as well as reduce power consumption have driven gate oxide thicknesses to well below 100 Angstroms. It was originally predicted that the physical limit of gate oxide thickness is somewhere around 30 Å because below this thickness carriers are removed by direct tunneling, faster than they can be supplied by thermal generation (Wolf, S., "Silicon Processing for the VLSI Era", Vol.3, Lattice Press, Sunset Beach, Calif., (1995), p438). However, recent studies by Bell Laboratories scientists now predict that the physical limit is of the order of 5 atoms which translates to about 14 Å for an $SiO_2$ dielectric.

MOSFET devices are currently being developed which have gate oxide thicknesses as low as 20 Å. As one might expect, serious new problems arise when the technology is driven to such levels requiring the invention of new methods to deal with them. Although some of these problems may not be generally soluble with today's technology, it is prudent to selectively exploit situations where the effects of these problems are minimal. It turns out that some devices are more susceptible to degradation than others. For example boron doped gate electrodes on p-channel devices are likely to degrade the channel region by emitting dopant across a thin oxide whereas this problem is much less likely to occur with arsenic doped gate electrodes on n-channel devices. These differences have led to the recent development of integrated circuits with dual oxide thicknesses. Thus, in a CMOS integrated circuit, the performance of the n-channel devices can be improved by selectively providing them with thinner gate oxides than the p-channel gate oxide thicker.

With regard to circuit device application, it is desirable to have a relatively thick gate oxide under the gates of the cell access transistors in a DRAM array to reduce wordline capacitance, while the performance of peripheral devices which drive the array would benefit from a relatively thin gate oxide. Such an application is cited by Gonzalez, U.S. Pat. No. 5,863,819. Growing two different gate oxide thicknesses is a challenge in itself. Typically, as in Gonzalez, the thicker oxide is grown first. Then a photomask is applied and the thicker oxide is etched away with aqueous HF from the gate regions where the thinner oxide is required. The mask is then stripped and the thinner oxide is grown.

A problem with this procedure is that a thin layer of native oxide forms on the silicon surface during a non-HF stripping and cleaning processes which remove the photoresist. An initial layer of about 10 Å thick continues to grow to a saturation thickness of about 16 to 18 Å. The native oxide is of poor structural quality and contains impurities. In the instance of Gonzalez a 10 Å native oxide is only about 10% of the total thin oxide. However, if left in place during the formation of a 20 Å thin gate oxide, the 10 Å of poor quality native oxide would comprise about half of the total. Obviously, a gate insulator with such a large poor quality portion would show degraded performance of the MOSFET. It would therefore be desirable to have a method for reducing, as much as possible, the native oxide from the silicon surfaces in the thin oxide device regions without damaging the already grown thicker gate oxide regions.

Beguwala, et.al., U.S. Pat. No. 4,277,320 in a process for direct thermal nitridation of silicon, shows the removal of a native oxide film in a chamber with ultrapure $H_2$ or with a dilute HF atmosphere. After oxide removal, a low pressure atmosphere of ionized $N_2$ or $NH_3$ is used to form a silicon nitride film. The native oxide removal and the thermal nitridation are sequentially performed in-situ within the same chamber. Thus there is no exposure of the fresh silicon surface to atmosphere prior to coverage by a nitride film.

Chau, et.al., U.S. Pat. No. 5,244,843 shows a method for forming a 60–80 Å gate oxides and controlling the formation of a native oxide by pushing the rack of wafers into the oxidation furnace at a controlled rate with $N_2$ flow. The native oxide layer is deliberately grown first so that it protects the silicon from chlorine attack during the subsequent gate oxidation wherein TCA (trichloroethane) is added to the oxidizing gas flow. Webb, et.al., U.S. Pat. No. 5,228,950 show a method for removing silicon rich oxide residues and polysilicon stringers by a high pressure $NF_3$ plasma etch. $NF_3$ is very corrosive and also attacks silicon.

SUMMARY OF THE INVENTION

It an object of this invention to provide an improved method for sequentially and selectively forming two different thicknesses of thermally grown silicon oxide on a silicon wafer.

It is another object of this invention to provide a method for sequentially growing a dual gate thermal oxides on a silicon wafer.

It is yet another object of this invention to provide a method for improving the uniformity and electrical breakdown characteristics of ultra thin gate oxides in dual gate integrated circuits.

These objects are accomplished by providing a wafer with regions defined by a field isolation, whereupon a thermal oxide is to be grown. The thicker of the two oxides is first grown on all of the exposed regions by conventional oxidation methods used to grow a gate oxide. A photoresist mask is then patterned on the wafer, exposing those regions which are to receive a thinner oxide. The just grown thicker oxide is next removed from these regions by etching with aqueous and preferably diluted buffered HF. The photoresist mask is removed by plasma ashing or by the use of a stripper and the wafer is subjected to a wet cleaning procedure which does not include HF. Next the wafer is subjected to a low pressure rapid thermal anneal or (bake) in an ambient containing $H_2$ and $N_2$ to remove native oxide and passivate the silicon surface. The wafer is then transferred to an oxidation furnace wherein a second thinner oxide is grown.

It is another object of this invention to provide a method for forming ultra thin gate oxides on silicon which are not degraded by residual native oxide films.

It is another object of this invention to provide a method for substantially reducing the thickness of native oxide films on silicon prior to thermal oxidation without employing HF or other silicon oxide etchants.

It is another object of this invention to provide a method for substantially improving the uniformity and quality of native oxide films on silicon prior to thermal oxidation without employing HF or other silicon oxide etchants.

These objects are accomplished by subjecting exposed silicon surfaces to a high temperature low pressure anneal in an ambient of $H_2$ and $N_2$. for a brief period. The anneal significantly reduces the native oxide thickness and converts it to a more uniform film which is substantially equivalent to thermal silicon oxide.

DESCRIPTION OF THE PREFERRED EMBODIMENTS

Figure 1A:
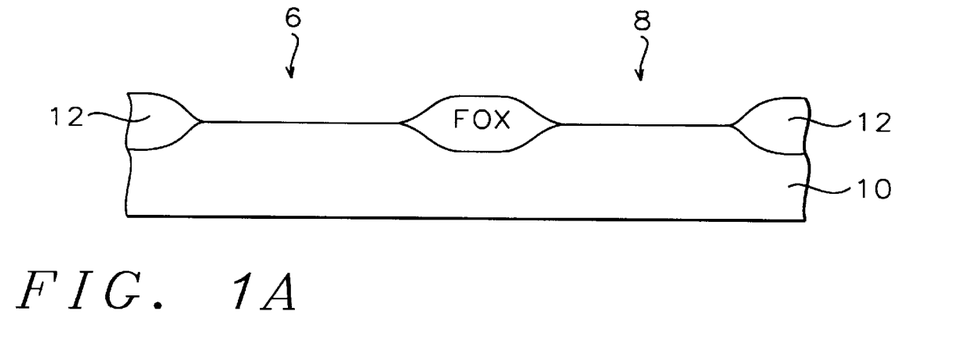
FIGS. 1A through FIG. 1E are cross sections illustrating processing steps for the formation of dual thickness thermal silicon oxides on a silicon wafer according to a first embodiment of this invention.

In a first embodiment of this invention two active silicon regions are defined on a p-type silicon wafer by field oxide isolation (FOX). A thermally grown silicon oxide is formed over each region. The oxide in a first region is of the order of 100 Å thick and represents a gate oxide used in the standard production MOSFET. The oxide formed over the second region is between about 15 and 30 Å thick and is representative of an ultra thin gate oxide used in newer, state of the art, high performance MOSFETs. Referring to FIG. 1A, there is shown a cross section of a p-type monocrystalline silicon wafer 10. A field oxide (FOX) 12 is patterned on the wafer 10 by the well known LOCOS method to surround a first region 6, wherein a relatively thick conventional gate oxide will be formed and a second region 8 wherein a relatively thin oxide will be formed. The LOCOS field oxide 12 is grown to a thickness of between about 0.6 and 0.7 microns.

Whereas the embodiment is illustrated using a LOCOS field oxide to separate the two regions, It will be appreciated that the thin an thick oxide regions may alternately abut one another or may be formed in different physical locations on the same wafer. An LOCOS field isolation is chosen for the embodiments because it is commonly used and well understood in integrated circuit applications. An alternate field isolation scheme such as STI (shallow trench isolation) could also be applied in the embodiments of this invention.

Figure 1B:
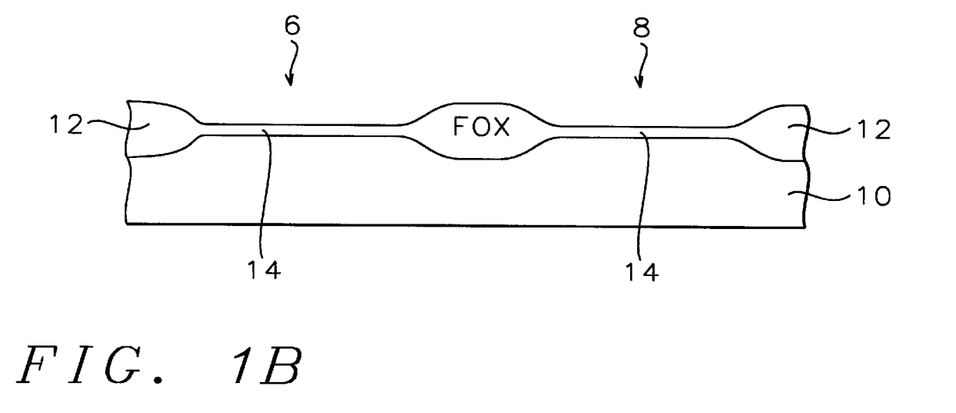
Figure 1C:
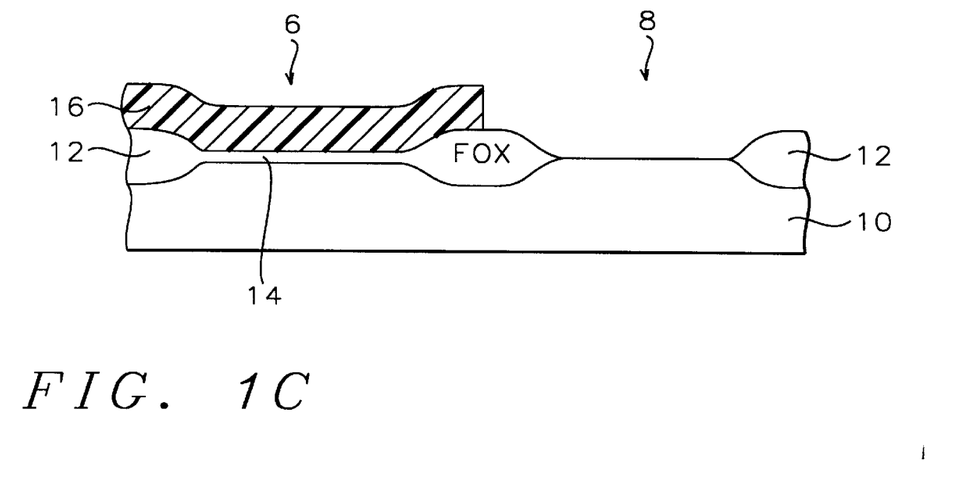

Referring to FIG. 1B a first thermal oxide 14 is grown on the exposed silicon. The first thermal oxide 14 is grown to a thickness of between about 40 and 100 Angstroms at a temperature of between about 600 and 1,000° C. in dry oxygen. Referring next to FIG. 1C, a photoresist mask 16 is patterned over the wafer to protect the first oxide 14 in the first region 6. Oxide 14 in the second region 8 is then selectively removed by bathing or dipping the wafer in a dilute aqueous HF etchant. A suitable etchant composition consists of a dilution of one part by volume of commercial semiconductor grade 49% HF with about 99 parts by volume of DI (de-ionized) water. For this dilution, a dip of between about 60 and 120 seconds is sufficient to entirely remove the exposed oxide 18 with negligible loss of adjacent exposed field oxide 12. The wafer 10 is then rinsed in DI water and dried. The photoresist mask 16 is then stripped using a liquid photoresist stripper.

Figure 1D:
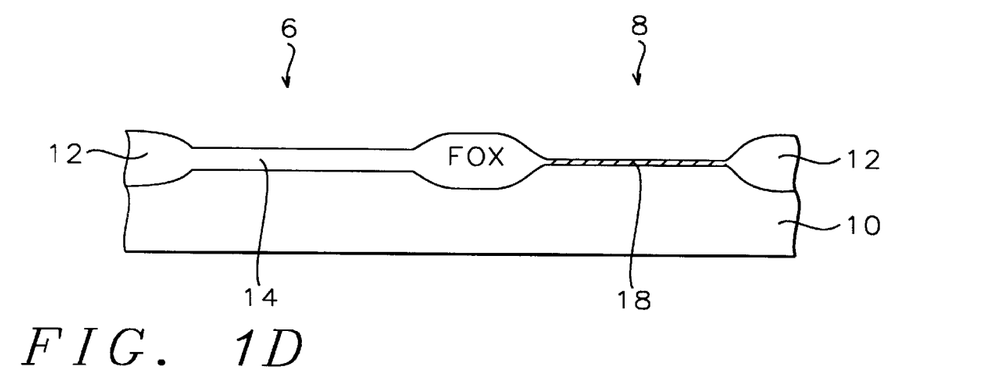

After stripping the photoresist, the wafer 10 is subjected to a wet cleaning procedure. The wet cleaning procedure consists of bathing the wafer sequentially in $NH_4OH/H_2O_2$ and $HCL/H_2O_2$ cleaning solutions. The method employed in this embodiment is a form of the well known RCA cleaning method but without HF. The RCA method has been used for cleaning particulates and other chemical residues from silicon wafers for many years. A discussion of the RCA technique may be found in Wolf, S. and Tauber, R. N.,"Silicon Processing for the VLSI Era", Vol. 1, Lattice Press, Sunset Beach, Calif., (1986),p516ff. The first ammoniacal solution(SC-1), is effective for removing organic residues and particulates while the second acidic solution (SC-2) is effective in removing metallic contaminants. The abbreviations SC-1 and SC-2 are commonly used and refer to standard clean 1 and 2. After stripping the photoresist, the wafers are sequentially dipped into the SC-1 solution, rinsed in DI water, dipped into the SC-2 solution, again rinsed in DI water, and finally rinsed with isopropyl alcohol and dried. Notably and importantly, the HF step which is often included between SC-1 and SC-2 in the RCA cleaning process, is omitted in the embodiments of this invention for the obvious reason that it would damage or remove the protected oxide layer 14. During and after the photoresist cleaning procedure, a native oxide film forms on the exposed silicon in the second region 8. FIG. 1D shows the wafer 10 with a native oxide film 18 which has formed and grown to a thickness of about 10 Angstroms.

The wafer 10 is next mounted in the chamber of a low pressure rapid thermal processing (LPRTP) tool and the chamber is evacuated. A suitable RTP tool is manufactured by Applied Materials Corporation in Santa Clara, Calif. Nitrogen, at flow rate of between about 1 and 10 slm (standard liters per minute) and hydrogen, at a flow rate of between about 0.1 and 1.0 slm, are then admitted into the chamber. The chamber pressure is maintained at between about 6 and 740 Torr by throttling the overall gas flow. The wafer is heated to a temperature of between about 600 and 1050° C. in the flowing hydrogen/nitrogen ambient, with quartz/iodine lamps for a period of between about 10 and 60 seconds. The heating lamps are then extinguished and the hydrogen flow is stopped. The wafer is allowed to cool in a nitrogen flow and removed from the tool. During the thermal processing, the native oxide, which had grown to thickness of about 10 Angstroms, is reduced to a film about 4 Angstroms thick. The residual film is believed to be of superior quality, more closely resembling thermal silicon oxide than the original film, because it's uniformity is markedly improved.

Figure 1E:
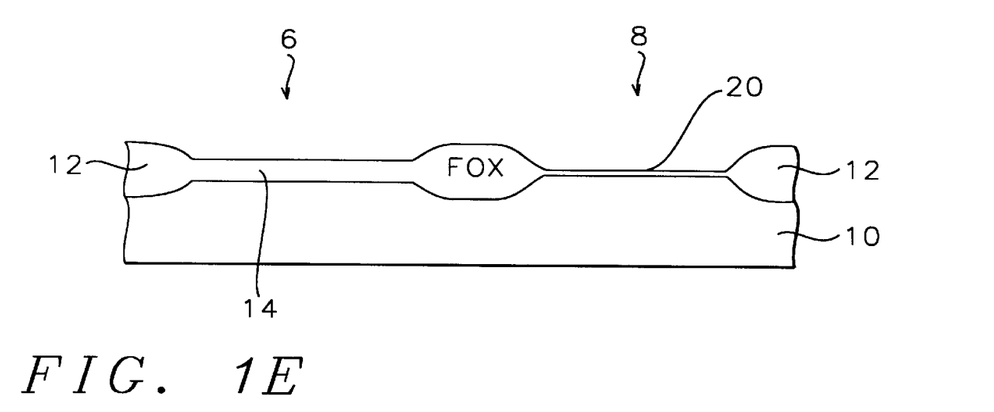

After the low pressure hydrogen bake, the wafer is placed into an oxidation furnace and a second thermal oxide is grown at a temperature of between about 600 and 800° C. Referring to FIG. 1E, a second oxide 20 is grown to a thickness of between about 15 and 50 Angstroms in a dry oxygen ambient. During the oxidation period the thicker oxide 14 in the first region 6 increases by a small predictable amount. Alternately the thin thermal oxide 20 may be formed by RTO (rapid thermal oxidation) or by ISSG (in-situ steam generation). However, a furnace grown thermal oxide is preferred.

Because the initial native oxide has been hardened and significantly reduced in thickness by the hydrogen bake, the thin oxide 20 is also significantly improved in quality as well as uniformity. Contaminants, initially present in the native oxide have been expelled and the residual portion of the native oxide has been essentially converted to a more robust form of silicon oxide.

Figure 2:
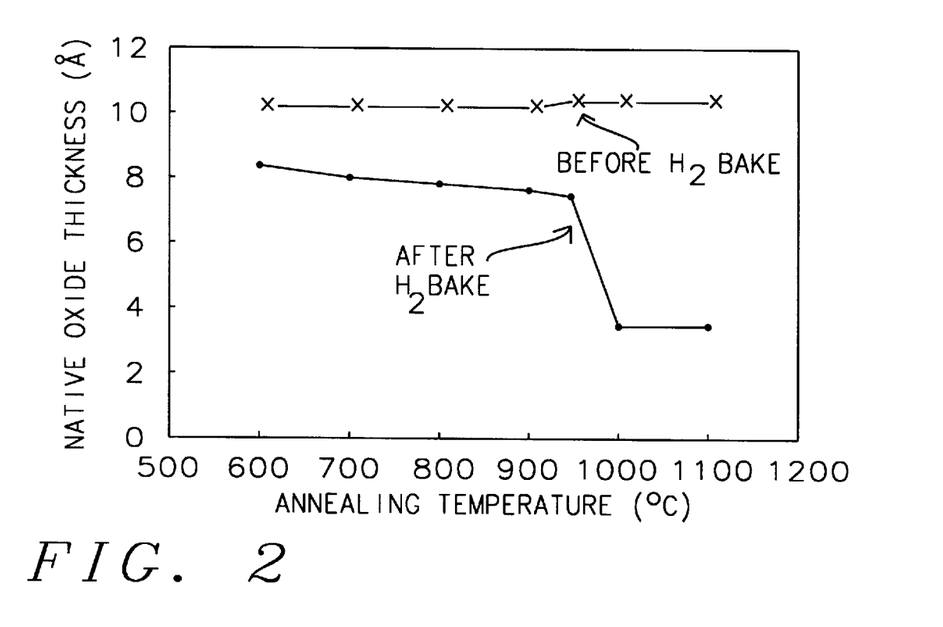
FIG. 2 is a chart showing the effect of temperature on the reduction in thickness of a native oxide film on a silicon wafer in a $H_2/N_2$ ambient according to the teaching of this invention.

A study was performed to examine the effects of a low pressure, high temperature hydrogen annealing of native oxide films on silicon. FIGS. 2 through 5 show some of the results of that study. FIG. 2 shows the effect of annealing temperature on the thickness of a native oxide film for a constant annealing time of 30 seconds. Oxide thickness measurements were made at various locations on each test wafer before and after a 30 second LPRTP step. The low pressure annealing was conducted in the chamber of an LPRTP tool in an ambient of hydrogen only, flowing at a rate of 0.99 slm. The chamber pressure was adjusted to maintain a pressure of about 50 Torr by throttling the pumping speed. The rapid heating was accomplished by quartz heating lamps and the wafer temperature was measured by Optical pyrometry. The annealing procedure is referred to in the figures as a "$H_2$ bake". Thicknesses of the surface films analyzed by this study were measured on a dual wave ellipsometer.

Figure 3:
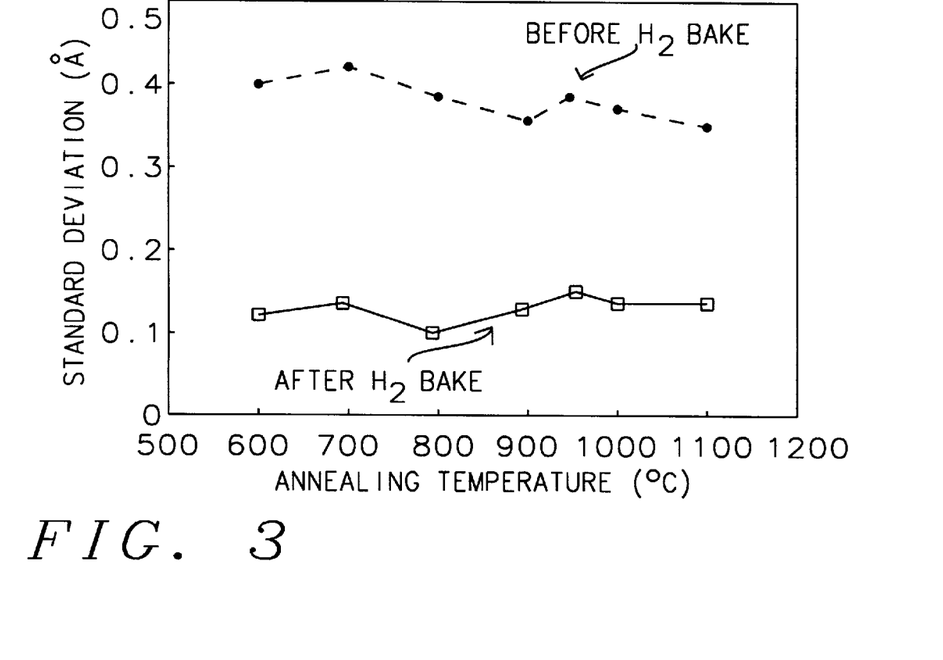
FIG. 3 is a chart showing the improvement of thickness uniformity of a native oxide film on a silicon wafer after annealing (baking) in a $H_2/N_2$ ambient at various temperatures according to the teaching of this invention.

It will be immediately seen in FIG. 2, that a 20% reduction in native film thickness was obtained at temperatures as low as 600° C. However, when the temperature is raised to about 950° C. or higher, a marked additional thickness reduction was observed. Although film thickness reduction is attainable at all temperatures studied, the most preferred operating range is between about 950 and 1,000° C. The uniformity of the native oxide film is illustrated by FIG. 3 where the standard deviations of the thickness measurements given in FIG. 2 are plotted. The data suggests that it is the initial 20% reduction in film thickness, which is observed to occur all the temperatures studied, that brings about a marked improvement in thickness uniformity. The additional thickness reduction that is only observed at temperatures above about 950° C., does not bring about further improvement of thickness uniformity.

Figure 4:
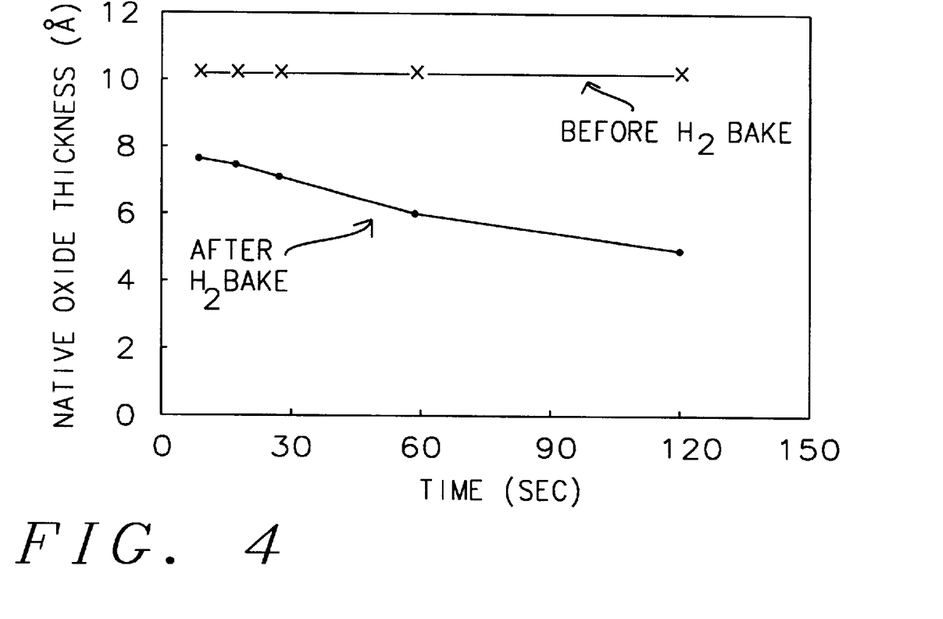
FIG. 4 is a chart showing the effect of time at temperature on the reduction in thickness of a native oxide film on a silicon wafer in a $H_2/N_2$ ambient according to the teaching of this invention.
Figure 5:
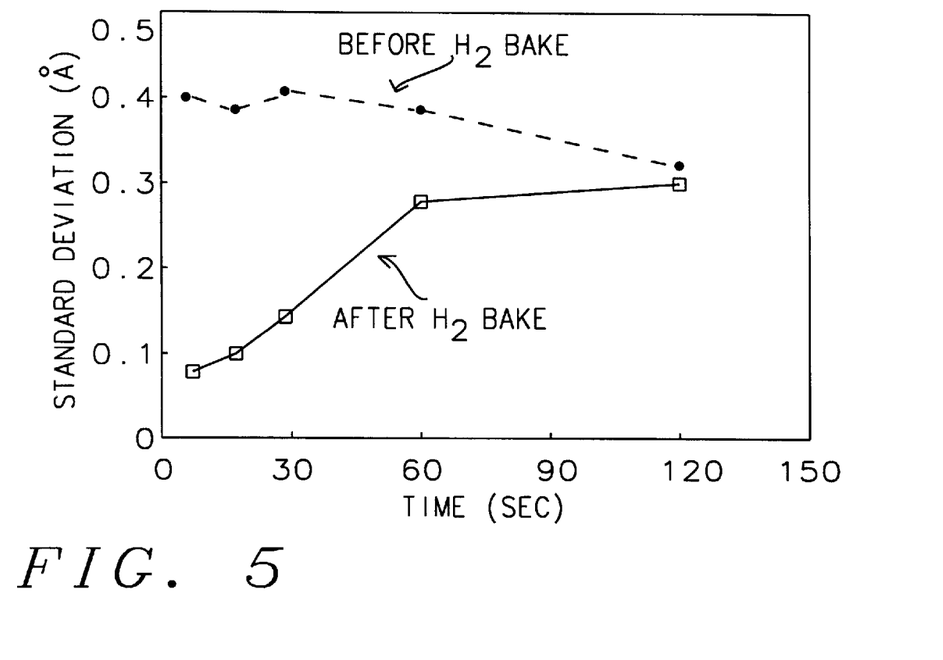
FIG. 5 is a chart showing the behavior of the thickness uniformity of a native oxide film on a silicon wafer as a function of time in a $H_2/N_2$ ambient at 950° C. according to the teaching of this invention.

FIG. 4 shows a graph of the time dependence of the thickness reduction of native oxide films on silicon using the $H_2$ LPRTP process taught by this invention. A plurality of thickness measurements were made on test wafers before and after LPRTP in $H_2$ at 950° C. for various lengths of time. The flow and pressure conditions of the $H_2$ LPRTP were the same as those for the previously describe experiments. FIG. 4 shows the initial rapid drop in thickness which was previously observed to occur at all the studied temperatures, followed by a slower descent in thickness to, what appears to be a limiting value of around 4 Angstroms. FIG. 5 is a chart of the standard deviation of the data displayed in FIG. 4 and shows that, although the additional time at temperature reduces the film thickness further, the thickness uniformity of the residual film is degraded. It is believed that damage to the subjacent silicon substrate by prolonged $H_2$ annealing is responsible for the worsening of thickness uniformity.

Without a full understanding of the mechanisms involved affecting the changes in the native film, it can be concluded from the data that the optimal temperature range for reducing the thickness of the native oxide film is between about 950 and 1,100° C. However, prolonged annealing beyond about 30 seconds is to be avoided.

Figure 6:
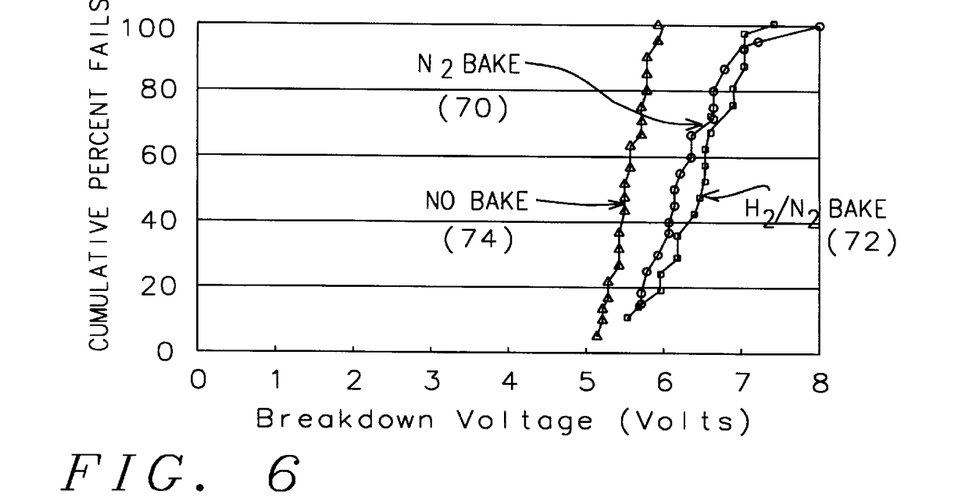
FIG. 6 is a chart showing the effect of baking a thin oxide grown by rapid thermal oxidation on the voltage breakdown characteristic.

FIG. 6 is a chart which shows the effect of post baking on the behavior of the voltage breakdown characteristic of 32 Angstrom thick oxide films. The films were grown by RTO. The curve 70 is the breakdown characteristic of an oxide which was post baked for 30 seconds in $N_2$ only at 1,050° C. Curve 72 is a breakdown characteristic of an oxide which was post baked for 30 seconds in the $H_2/N_2$ mixture of the embodiment at 1,050° C. Curve 74 is the breakdown characteristic of an oxide which received no post bake. The data shows that the thermal procedure alone significantly improves the breakdown property of the oxide films and that the added hydrogen, while offering no measurable improvement, does not attack or degrade. The conclusion to be drawn from this experiment is that the $H_2$ containing bake of the invention does not degrade the already grown oxide in a dual gate oxide process.

In a second embodiment of this invention a p-channel MOSFET, having a relatively thick gate oxide and a high performance n-channel MOSFET, with a relatively thin a gate oxide are formed. Such a combination may be designed as a CMOS inverter pair or the two devices may be located apart from each other in different circuit applications, for example the p-channel device may be a cell transistor in a DRAM array and the n-channel device may perform logic services in a peripheral circuit. For illustrative purposes a CMOS pair will be described with the two devices located adjacent to each other.

Figure 7A:
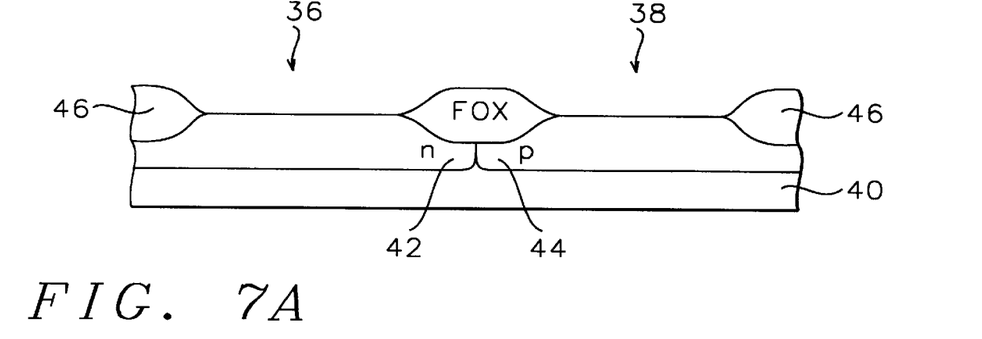
FIGS. 7A through FIG. 7F are cross sections illustrating processing steps for the formation of dual thickness thermal silicon oxides on a silicon wafer according to the teaching of a second embodiment of this invention.

Referring to FIG. 7A, a p-type monocrystalline silicon wafer 40. In accordance with a conventional CMOS process, an n-well 42 and a p-well 44 are patterned in the surface of wafer 40 to form active silicon regions for the two devices. A field oxide 46 is formed on the wafer 40, isolating a portion of n-type active silicon surface in the region 36 and a portion of p-type active silicon surface in region 38. The field oxide 46 is formed by the LOCOS method. Alternately, shallow trench isolation (STI) may be used to form a field isolation. In this procedure, trenches are etched into the silicon surface and filled will an insulative material such as silicon oxide. The p-channel MOSFET will be formed in region 36 while the n-channel MOSFET will occupy region 38.

Regions 36 and 38, in a CMOS pair, are generally located adjacent to each other. However, in other applications, regions 36 and 38 could be located anywhere on the same wafer. In the example of the embodiment, the gate oxide for the n-channel MOSFET to be formed in region 38 is less than 50 Å thick and preferably between about 15 and 30 Å thick. The gate oxide thickness of the p-channel MOSFET to be formed in region 36 will be of the order of about 100 Å or less.

Figure 7B:
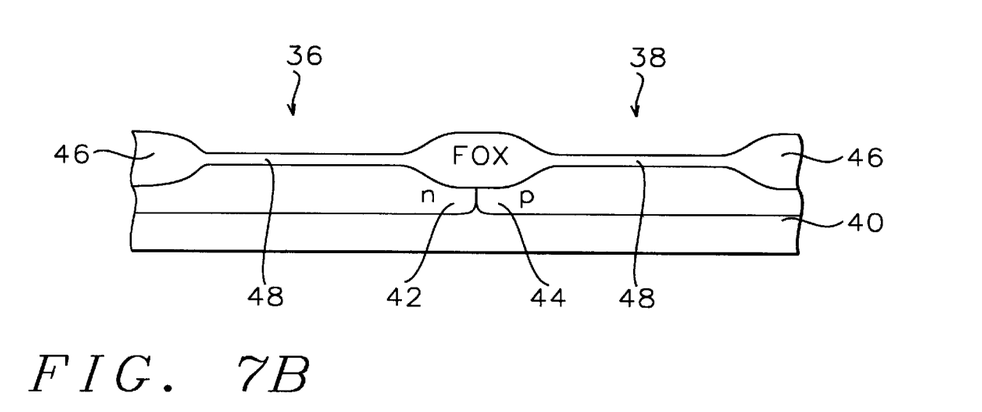

Referring to FIG. 7B, a first gate oxide 48 is grown on the silicon in regions 36 and 38. Gate oxide 48 is grown in a conventional manner to a thickness of between about 40 and 100 Å. Preferably, gate oxide 48 is grown in a furnace in dry oxygen at a temperature of between 800 and 1,000° C. following well known gate oxidation practices.

Figure 7C:
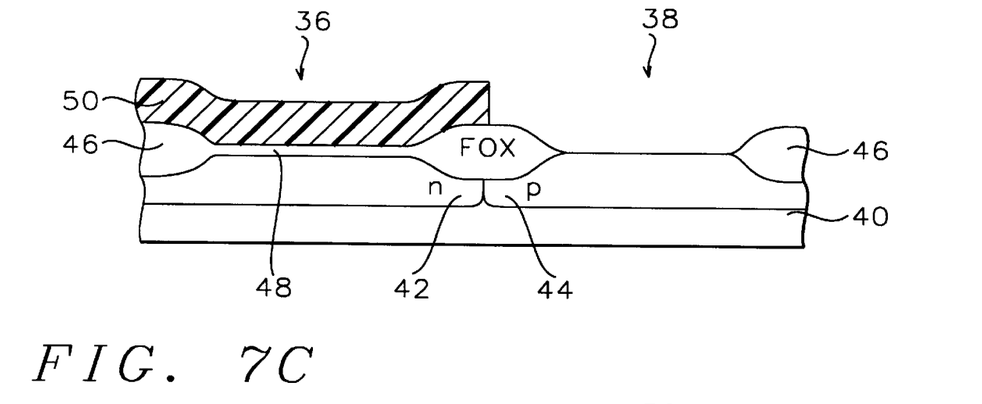

Referring next to FIG. 7C, a photoresist mask 50 is patterned over the wafer to protect the first oxide 48 in the first region 36. Oxide 48 in the second region 38 is then removed by a dip in a dilute aqueous HF etchant. A suitable etchant composition consists of a dilution of one part by volume of commercial semiconductor grade 49% HF with about 100 parts by volume of DI water. For this dilution, a dip of between about 60 and 120 seconds is sufficient to entirely remove the exposed oxide 48 with negligible loss of adjacent exposed field oxide 46. The wafer 40 is rinsed in DI water and dried. The photoresist mask 50 is then stripped using a liquid photoresist stripper.

Figure 7D:
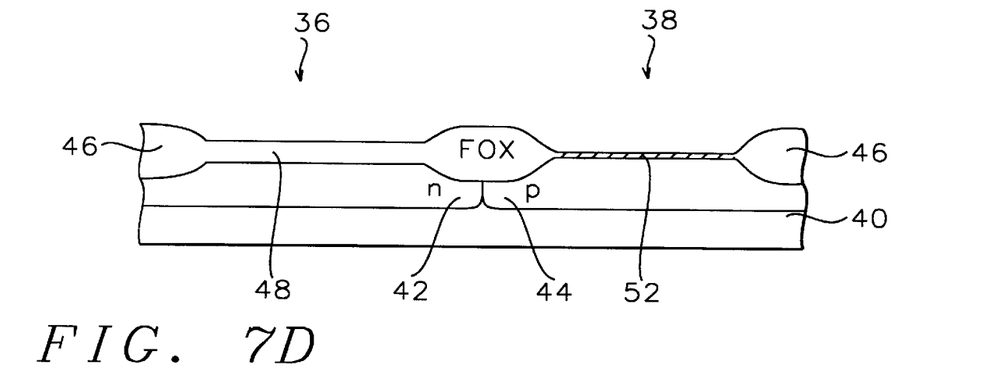

After stripping the photoresist, the wafer 40 is subjected to the wet cleaning procedure described in detail in the discussion of the first embodiment. The wafers are sequentially dipped into the SC-1 solution, rinsed in DI water, dipped into the SC-2 solution, again rinsed in DI water, and finally rinsed with isopropyl alcohol and dried. Notably and importantly, the HF step which is often included between SC-1 and SC-2 in the RCA cleaning process, is omitted for the obvious reason that it would damage or remove the protected oxide layer 14. During and after the photoresist cleaning procedure, a native oxide (not shown) forms on the exposed silicon in the second region 38. FIG. 7D shows the wafer 40 with a native oxide film 52 which has formed and grown to a thickness of about 10 Angstroms shortly after the thermal oxide 48 was removed.

The wafer 40 is next mounted in the chamber of a low pressure rapid thermal processing (LPRTP) tool and the chamber is evacuated. A suitable tool is manufactured by Applied Materials Corporation in Santa Clara, Calif. Nitrogen, a flow rate of between about 1 and 10 slm and hydrogen at a flow rate of between about 0.1 and 1.0 slm are then admitted into the chamber. The chamber pressure is maintained at between about 6 and 740 Torr by throttling the overall flow. The wafer is heated to a temperature of between about 600 and 1050° C.) in the hydrogen/nitrogen ambient, with quartz/iodine lamps for a period of between about 10 and 60 seconds. The heating lamps are then extinguished and the hydrogen flow is stopped. The wafer is allowed to cool in a nitrogen flow and removed from the tool. During the rapid thermal annealing step, the native oxide, which had grown to thickness of about 10 Angstroms, is reduced to a film about 4 Angstroms thick. The residual film is believed to be of superior quality, more closely resembling thermal silicon oxide than the original film, because it's uniformity is markedly improved.

Figure 7E:
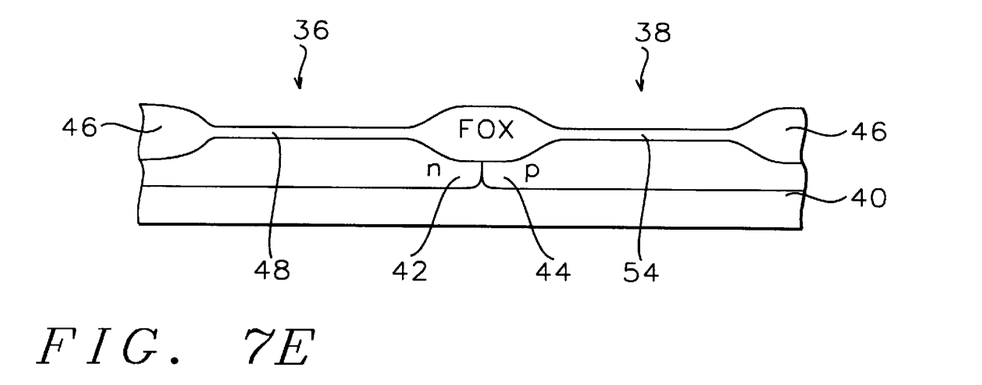

After the low pressure hydrogen anneal, the wafer 40 is placed into an oxidation furnace and a second thermal oxide is grown at a temperature of between about 600 and 800° C. Referring to FIG. 7E, a second oxide 54 is grown to a thickness of between about 15 and 50 Angstroms in a dry oxygen ambient. During the oxidation period the thicker oxide 48 in the first region 36 increases in thickness by a small predictable amount. Alternately the thin thermal oxide may be formed by RTO or by ISSG. However, the furnace grown thermal oxide is preferred. Because the initial native oxide has been hardened and significantly reduced in thickness by the hydrogen anneal, the thin oxide 54 is also significantly improved in quality as well as uniformity. Contaminants, initially present in the native oxide have been expelled and the residual portion of the native oxide has been essentially converted to a more robust form of silicon oxide.

Polysilicon gate electrodes are next patterned over the gate oxides 48 and 54. Preferably, a blanket layer of polysilicon is first deposited over the wafer 40. The conductivity of the upper portion of the polysilicon layer is enhanced by depositing a refractory metal silicide, for example tungsten suicide or titanium silicide on the polysilicon layer. Alternately the upper portion of the polysilicon layer may be doped with an impurity, for example arsenic. An insulative layer such as silicon oxide or silicon nitride is deposited on the silicide layer to form an insulative cap over the gate electrode, thereby preventing gate-to-source/drain shorts.

The deposited layers are then patterned by conventional techniques to form gate electrodes. The layers are patterned by forming a photoresist mask pattern on the wafer 40 and etching the layers successively by plasma etching or RIE (reactive ion etching). Etching of the polysilicon is accomplished using etchant gases and parameters which provide a high etch rate selectivity for polysilicon over silicon oxide. Such gases include chlorine, HBr, and $NF_3$. The gate oxide must be of high quality and uniformity in order to prevent penetration of the polysilicon etchant into the substrate silicon.

Most polysilicon gate patterning recipes include at least three etching steps performed successively in the same etching tool. The first of these steps is a relatively fast anisotropic etch wherein the greater portion of the polysilicon gate stack is etched. This etch step typically includes $Cl_2$ and etchant conditions which give high silicon-to-mask etch selectivity. The second step uses an etchant gas mixture which includes HBr and helium and plasma conditions which are tailored to give as high a silicon-to-$SiO_2$ selectivity as possible. Helium is considered essential because it improves the uniformity of the etching. The second etching step proceeds until subjacent gate oxide is exposed. The final step is a timed over etch which assures thorough removal of all residual patches or stringers of polysilicon. The gate oxide not only must serve as an etch stop for the gate etch but must also endure an additional over etch period to ensure thorough polysilicon removal from the etch region. It will be appreciated that the final etch step and the over etch are grossly intolerant of defects in the gate oxide, and penetration of the oxide at these defects will result in penetration of the subjacent silicon. By removing or at least reducing the thickness of and stabilizing any residual native oxide according to the method of this invention, the subsequently grown second thin gate oxide is uniform and robust and therefore better able to withstand the gate etch.

Figure 7F:
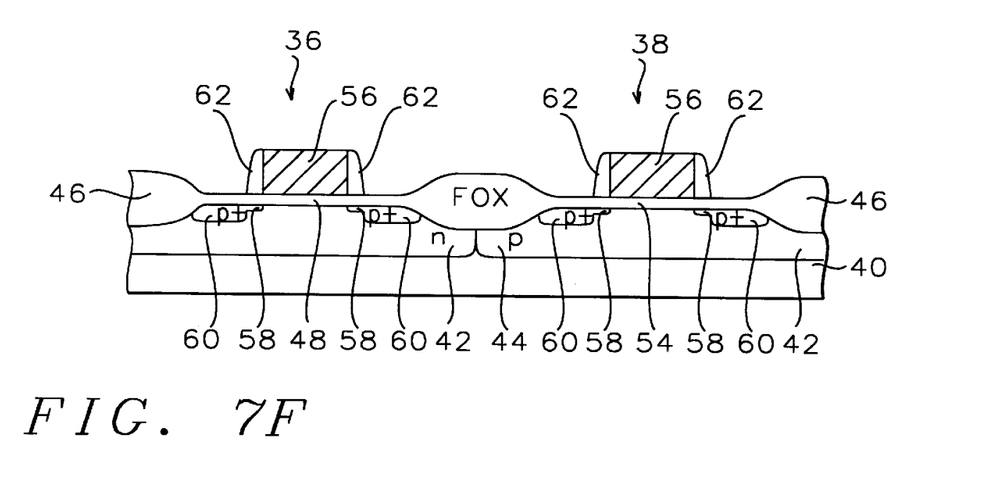

The completed polysilicon gate electrodes 56 are shown in FIG. 7F. LDD (lightly doped drain) regions 58 and source/drain regions 60 are next formed by conventional ion implantation processing using sidewall spacers 62. These procedures are well known and widely practiced in the industry and need not be detailed here. The p- and n-channel MOSFETs are now complete. It remains to deposit an interlevel dielectric layer and form source/drain and gate contacts to the respective elements of each MOSFET by the conventional methods.

While the invention has been particularly shown and described with reference to the preferred embodiments thereof, it will be understood by those skilled in the art that various changes in form and details may be made without departing from the spirit and scope of the invention. While the embodiments of this invention utilize a p-type silicon substrate, an n-type silicon substrate could also be used without departing from the concepts therein provided.

While the regions of the wafer wherein the thick and thin oxides are formed are defined by field oxide in the embodiments, it is to be understood that the manner in which the regions are defined is arbitrary and is not critical to the process of the invention. Alternate defining criteria may be used without departing from the spirit and scope of the invention.

What is claimed is:

1. A method for forming two thicknesses of gate oxide on a silicon wafer comprising:
   (a) providing a silicon wafer;
   (b) growing a first oxide on said wafer;
   (c) etching away said first oxide in a first region;
   (d) cleaning said wafer with a non-HF utilizing procedure whereupon a native oxide is formed over said first region;
   (e) subjecting said wafer to a low pressure thermal anneal in a ambient containing $H_2$, thereby reducing the thickness of said native oxide and expelling contaminants therefrom; and
   (f) growing a second oxide on said wafer.

2. The method of claim 1 wherein said first oxide is grown to an initial thickness of between about 40 and 100 Angstroms.

3. The method of claim 1 wherein said cleaning is accomplished by bathing said wafer sequentially in $NH_4OH/H_2O_2$ and $HCL/H_2O_2$ cleaning solutions with intermediate deionized water rinses.

4. The method of claim 1 wherein said anneal is accomplished in chamber containing $N_2$ flowing at a rate of between about 1 and 10 standard liters per minute and the $H_2$ flowing at a rate of between about 0.1 and 1.0 standard liters per minute while the surface of said wafer is heated to a temperature of between about 600 and 1050° C. and at a total chamber pressure of between about 6 and 740 Torr.

5. The method of claim 1 wherein said second oxide is grown at a temperature of between about 600 and 800° C.

6. A method for forming a first MOSFET with a first gate oxide thickness and a second MOSFET with a second gate oxide thickness on a silicon wafer comprising:
   (a) providing a silicon wafer;
   (b) forming field oxide isolation areas on said silicon wafer surrounding and electrically isolating device areas, said device regions comprised of a first device region and a second device region;
   (c) growing a first oxide on said device regions;
   (d) patterning a photoresist layer on said wafer to expose said first oxide on a said first device region;
   (e) etching said first oxide exposed on said first device region;
   (f) stripping said photoresist layer;
   (g) cleaning said wafer with a non-HF utilizing procedure, whereupon a native oxide is formed over said second device region;
   (h) subjecting said wafer to a low pressure thermal anneal in a ambient containing $H_2$, thereby reducing the thickness of said native oxide and expelling contaminants therefrom;
   (i) growing a second oxide on said first device region;
   (j) forming a gate electrode over each of said device regions; and
   (k) forming source/drain elements in said device regions, thereby forming said first and said second MOSFETs.

7. The method of claim 6 wherein said cleaning is accomplished by dipping said wafer sequentially into $NH_4OH/H_2O_2$ and $HCL/H_2O_2$ cleaning solutions with intermediate DI water rinses.

8. The method of claim 6 wherein said anneal is accomplished in chamber containing $N_2$ at a flow rate of between about 1 and 10 standard liters per minute and the $H_2$ at a flow rate of between about 0.1 and 1.0 standard liters per minute while the surface of said wafer is heated to a temperature of between about 600 and 1050° C. and at a total chamber pressure of between about 6 and 740 Torr.

9. The method of claim 6 wherein said second oxide is grown at a temperature of between about 600 and 800° C.

* * * * *